US008638601B1

(12) United States Patent
Parkin et al.

(10) Patent No.: US 8,638,601 B1
(45) Date of Patent: Jan. 28, 2014

(54) DOMAIN WALL MOTION IN PERPENDICULARLY MAGNETIZED WIRES HAVING MAGNETIC MULTILAYERS WITH ENGINEERED INTERFACES

(75) Inventors: Stuart Stephen Papworth Parkin, San Jose, CA (US); Luc Thomas, San Jose, CA (US); See-Hun Yang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/543,061

(22) Filed: Jul. 6, 2012

(51) Int. Cl.
*G11C 11/14* (2006.01)
(52) U.S. Cl.
USPC ............. 365/171; 365/80; 365/158; 365/173
(58) Field of Classification Search
USPC ......... 365/48, 55, 62, 66, 74, 78, 80–93, 100, 365/130, 131, 148, 158, 171–173, 225.5, 365/243.5; 216/22; 257/421, E21.665; 438/3; 977/933–935
See application file for complete search history.

(56) References Cited

U.S. PATENT DOCUMENTS

| | | | |
|---|---|---|---|
| 6,834,005 B1 | 12/2004 | Parkin | |
| 6,898,132 B2 | 5/2005 | Parkin | |
| 6,920,062 B2 | 7/2005 | Parkin | |
| 7,108,797 B2 * | 9/2006 | Chen et al. | 216/22 |
| 7,551,469 B1 | 6/2009 | Parkin | |
| 7,652,906 B2 * | 1/2010 | Lim et al. | 365/81 |
| 7,710,756 B2 * | 5/2010 | Lim et al. | 365/81 |
| 7,751,224 B2 * | 7/2010 | Lim et al. | 365/80 |
| 7,876,595 B2 * | 1/2011 | Xi et al. | 365/80 |
| 7,924,594 B2 * | 4/2011 | Lim et al. | 365/80 |
| 7,965,468 B2 | 6/2011 | Rhie | |
| 7,965,470 B2 * | 6/2011 | Lim et al. | 360/131 |
| 8,313,847 B2 * | 11/2012 | Cho et al. | 428/827 |
| 2004/0251232 A1 * | 12/2004 | Chen et al. | 216/22 |
| 2008/0025060 A1 * | 1/2008 | Lim et al. | 365/86 |
| 2008/0068936 A1 * | 3/2008 | Lim et al. | 369/13.06 |
| 2008/0137405 A1 | 6/2008 | Ohno et al. | |
| 2008/0138661 A1 * | 6/2008 | Lim et al. | 428/827 |
| 2008/0258247 A1 | 10/2008 | Mancoff et al. | |
| 2009/0168493 A1 | 7/2009 | Kim et al. | |
| 2009/0185312 A1 * | 7/2009 | Cho et al. | 360/131 |
| 2009/0303631 A1 | 12/2009 | Rhie | |
| 2010/0061135 A1 | 3/2010 | Nagasaka et al. | |

(Continued)

FOREIGN PATENT DOCUMENTS

| | | |
|---|---|---|
| EP | 1701357 A1 | 9/2006 |
| WO | 2007063718 A1 | 6/2007 |
| WO | 2010020440 A1 | 2/2010 |

OTHER PUBLICATIONS

Parkin, "Racetrack Memory: a storage class memory based on current controlled magnetic domain wall motion", IEEE 978-1-4244-3527, Feb. 2009, pp. 3-6.

(Continued)

*Primary Examiner* — Harry W Byrne
(74) *Attorney, Agent, or Firm* — Daniel E. Johnson

(57) ABSTRACT

Magnetic wires that include cobalt, nickel, and platinum layers show improved domain wall motion properties, when the domain walls are driven by pulses of electrical current. These wires exhibit perpendicular magnetic anisotropy, thereby supporting the propagation of narrow domain walls. The direction of motion of the domain walls can be influenced by the order in which the platinum and cobalt layers are arranged.

28 Claims, 13 Drawing Sheets

(56) References Cited

U.S. PATENT DOCUMENTS

| | | | |
|---|---|---|---|
| 2010/0085659 A1* | 4/2010 | Choe et al. | 360/77.01 |
| 2010/0118583 A1 | 5/2010 | Hung et al. | |
| 2010/0128510 A1 | 5/2010 | Cowburn | |
| 2010/0148288 A1 | 6/2010 | Johnson | |
| 2010/0238698 A1* | 9/2010 | Lim et al. | 365/80 |
| 2011/0163402 A1 | 7/2011 | Fukami et al. | |
| 2011/0170342 A1 | 7/2011 | Dimitrov et al. | |
| 2012/0250398 A1* | 10/2012 | Morise et al. | 365/157 |

OTHER PUBLICATIONS

Lau et al., "Magnetic nanostructures for advanced technologies: fabrication, metrology and challenges", Journal of Physics D: Applied Physics, 44, 303001, 2011, pp. 1-43.

Fukami et al., "Stack Structure Dependence of Co/Ni Multilayer for Current-Induced Domain Wall Motion", Applied Physics Express 3, 2010, pp. 113002-1-13002-3.

Fukami et al., "Low-Current Perpendicular Domain Wall Motion Cell for Scalable High-Speed MRAM", Symposium on VLSI Technology Digest of Technical Papers, 2009, pp. 230-231.

Miron et al., "Current-driven spin torque induced by the Rashba effect in a ferromagnetic metal layer", Letters Nature Materials, vol. 9, Mar. 2010, pp. 230-234.

Miron et al., "Fast current-induced domain-wall motion controlled by the Rashba effect", Letters Natural Materials, vol. 10, Jun. 2011, pp. 419-423.

Rodmacq et al., "Influence of thermal annealing on the perpendicular magnetic anisotropy of Pt/Co/AlOx trilayers", Physical Review B 79, 2009, pp. 024423-1-024423-8.

Thomas et al., "Racetrack Memory: a high-performance, low-cost, non-volatile memory based on magnetic domain walls", IEEE 978-1-4577-0505, Feb. 2011, pp. 242.1-24.2.4.

Daalderop et al., "Prediction and Confirmation of Perpendicular Magnetic Anisotropy in Co/Ni Multilayers", Physical Review Letters, vol. 68, No. 5, Feb. 3, 1992, pp. 682-685.

Parkin et al., "Magnetic Domain-Wall Racetrack Memory", Science, vol. 320, Apr. 11, 2008, pp. 190-194.

Hayashi et al., "Current-Controlled Magnetic Domain-Wall Nanowire Shift Register", Science, vol. 320, Apr. 11, 2008, pp. 209-211.

Weller et al., "Orbital magnetic moments of Co in multilayers with perpendicular magnetic anisotropy", Physical Review, 1994, vol. 49, No. 18, pp. 12888-12896.

Wilhelm et al., "Interface magnetism in 3d/5d multilayers probed by X-ray magnetic circular dichroism", Phys. Stat. Sol. (a), 2003, vol. 196, No. 1, pp. 33-36.

PCT International Search Report and the Written Opinion, International application No. PCT/EP2013/061367, Jul. 18, 2013.

* cited by examiner

DOMAIN WALL MOTION IN PERPENDICULARLY MAGNETIZED WIRES HAVING MAGNETIC MULTILAYERS WITH ENGINEERED INTERFACES

TECHNICAL FIELD

The present invention relates to memory storage systems, and particularly to a memory storage system that uses electrical current to move magnetic domain walls in a magnetic wire, with data being stored in the domain walls or their associated domains.

BACKGROUND

Racetrack memory is a memory-storage device in which data are stored in magnetic nanowires in the form of magnetic domain walls that separate magnetic regions magnetized in opposite directions (see, for example, U.S. Pat. Nos. 6,834,005, 6,920,062, and 7,551,469 to Parkin). A key principle underlying this memory is the controlled motion of a series of such domain walls backwards and forwards along the nanowires (also known as racetracks) using nanosecond long pulses of current applied along the nanowire. Devices to inject domain walls and to detect domain walls are integrated into each of the nanowires. The domain walls are moved to the injection and detection devices by means of current pulses of the necessary length and number. The racetracks can be formed from two distinct classes of magnetic materials in which the magnetization of the material is (a) predominantly oriented within the plane and along the length of the nanowire and (b) predominantly oriented perpendicular to the length of and perpendicular to the plane of the nanowire. Materials that form class (a) are typically composed of soft magnetic materials in which the intrinsic magnetocrystalline anisotropy of the material is small compared to the shape magnetic anisotropy derived from magnetostatic energies associated with the cross-sectional shape and size compared to the length of the nanowire. In these materials the domain walls are typically wide: for example, the domain walls in nanowires formed from permalloy, an alloy of Ni and Fe in the approximate atomic composition ratio 80:20, are typically 100-200 nm wide, and these domain walls can be readily deformed. Materials that form class (b) are typically composed of ultrathin magnetic layers in which their interfaces with non-magnetic layers give rise to interfacial magnetic anisotropies that can result in their magnetization preferring to be oriented perpendicular to these interfaces. Typical examples include an ultrathin layer of Co placed adjacent to a Pt layer and multilayered structures formed from alternating layers of atomically thin Co and Pt layers. Another example are multilayers formed from ultrathin layers of Co and Ni. For such materials the width of the domain walls are smaller, the greater is the perpendicular magnetic anisotropy (PMA) and can be as narrow as 1-10 nm. Thus materials of class (b) are preferred for the fabrication of dense racetrack memories.

In prior art devices the domain walls are shifted to and fro along racetracks by current pulses in which the current is spin-polarized as a result of spin-dependent scattering within the bulk of the magnetic materials from which the racetrack is formed. The transfer of spin angular momentum from the spin polarized current to the domain wall gives rise to a torque on the magnetic moments within the domain wall that results in motion of the domain wall along the nanowire. This phenomenon of spin transfer torque (STT) results in the domain walls being driven in the direction of the flow of spin angular momentum such that spin angular momentum is transferred from the current to the magnetic moments. It is well established that in permalloy the conduction electrons that carry the electrical current are majority spin polarized, i.e., the conduction electrons have their magnetic moments oriented parallel to the direction of the local magnetic moments on the Ni and Fe atoms. This results in magnetic domain walls in permalloy nanowires moving in the direction of the flow of the conduction electrons, i.e., opposite to the direction of the electrical current. The velocity of the domain walls depends on the magnitude of the electrical current and for current densities of ~$10^8$ A/cm$^2$ in permalloy, the domain walls move with velocities of ~100 m/sec.

Domain walls can be pinned by defects arising from roughness of the edges or surfaces of the nanowires. In permalloy and other materials in class (a) the interaction of the spin polarized current and the domain wall's magnetization is such that very large current densities are required to move domain walls that are pinned by even comparatively small pinning potentials. For example a current density of ~$10^8$ A/cm$^2$ can overcome effective pinning fields of just a few Oersted. By contrast the much narrower domain walls in materials of class (b) changes the details of the interaction of spin polarized current and the domain wall's magnetization so that much larger pinning fields can be overcome compared to the domain walls in materials of class (a) for otherwise the same current density. Since nanowires will inevitably have rough edges and surfaces this is a significant advantage of materials in class (b).

Finally, a third advantage of materials of class (b) is that racetracks with PMA can be made magnetically very thin, just a few atomic layers thick, and yet the domain walls can be stable against thermal fluctuations because of the very large PMA. Since the magnetic nanowires are very thin, and therefore contain proportionally less magnetic moment, domain walls can be injected into the nanowires using injection devices that use spin torque transfer from currents injected across tunnel barriers into the racetracks. For materials in class (a) the racetracks of prior art devices have to be formed from much thicker magnetic layers in order to stabilize domain walls with a vortex domain structure that can be moved with currents. In thinner racetracks formed from materials of class (a) the domain walls have a transverse wall structure that requires much higher current densities to move them.

SUMMARY

Preferred embodiments and implementations of the current invention are directed to moving domain walls with currents at high efficiency in wires with perpendicular magnetic anisotropy that allow for narrow domain walls (DWs). The convention adopted herein is that the first layer deposited on the substrate is the "bottom"-most layer, whereas the last deposited layer is the "top"-most layer. Likewise, "above", "below", "under", and "over" are defined with respect to the order in which layers are formed, rather than gravity. The layers of a stack are listed in the order in which they are deposited.

We show that domain walls in magnetic stacks formed from Co layers or Co/Ni/Co trilayers or Co/[Ni/Co]$_N$ (where N indicates the number of bilayers) multilayers can be driven by current either along or against the current flow direction by engineering the interfaces at the bottom and top of the magnetic stack or within the magnetic stack itself. Furthermore, we show that the mechanism for driving the domain walls strongly depends on the nature of the metallic materials below, above, and within the magnetic stack. When the magnetic stack is grown on Pt, Pd, and Ir, the interface between these metals and the bottom Co layer drives the domain walls in the direction of current flow. When these metals are deposited on top of the magnetic stack, the interface gives rise to a mechanism that drives the domain walls in the opposite direction, i.e., that of the electron flow. The introduction of a thin Pt layer within the stack between a Co and a Ni layer drives the domain walls in the current direction when the Pt is introduced below a Co layer, and in the opposite direction when the Pt layer is introduced above a Co layer. The velocity with which the domain walls are driven by current depends on the total number of Pt/Co and Co/Pt interfaces. In addition to these interface current driven domain wall mechanisms, the intrinsic bulk mechanism that drives the domain walls in Co/Ni multilayers along the electron flow is also operative. The thicker and the larger the number of Co and Ni layers, the more dominant is this mechanism. The interface current DW driving mechanism can drive domain walls at high speed. We show that DW velocities of up to ~350 m/sec at current densities of ~4×10$^8$ A/cm$^2$ can be realized in Pt/Co/Ni/Co magnetic wires.

One aspect of the invention is a method that includes providing a magnetic wire that acts as a track for the motion of a domain wall (or a plurality of domain walls), in which the wire includes an underlayer, an overlayer, and intermediate layers between the underlayer and the overlayer. The intermediate layers include (i) at least one bilayer selected from the group consisting of Co/Ni and Ni/Co, in which each Ni layer in said at least one bilayer is ferromagnetic and includes at least 20 atomic percent Ni, and each Co layer in said at least one bilayer is ferromagnetic and includes at least 20 atomic percent Co and (ii) a Pt layer in contact with two of the intermediate layers, one of which is Co and the other of which is Ni, in which the Pt layer includes at least 70 atomic percent Pt. The wire has an easy magnetization direction perpendicular to an interface separating adjacent Co and Ni layers in the intermediate layers. The underlayer, the overlayer, and the intermediate layers extend along at least a portion of the length of the wire. The method further includes applying current to the wire, thereby moving a domain wall along the wire, in which the domain wall extends (i) across all of the intermediate layers and (ii) into at least a portion of the underlayer and/or into at least a portion of the overlayer.

Another aspect of the invention is a method that includes providing a magnetic wire that acts as a track for the motion of a domain wall (or a plurality of domain walls), in which the wire includes at least one trilayer selected from the group consisting of Co/Pt/Ni and Ni/Pt/Co, with the trilayer extending along at least a portion of the length of the wire. Each Ni layer in said at least one trilayer is ferromagnetic and includes at least 20 atomic percent Ni, each Co layer in said at least one trilayer is ferromagnetic and includes at least 20 atomic percent Co, and the Pt layer includes at least 70 atomic percent Pt. The wire has an easy magnetization direction perpendicular to an interface separating adjacent Co and Ni layers in the trilayer. The method further includes applying current to the wire, thereby moving a domain wall along the wire, in which the domain wall extends throughout the trilayer.

The Co layers preferably have a thickness between 1 and 10 angstroms (and more preferably between 1 and 4.5 angstroms), the Ni layers preferably have a thickness between 1 and 10 angstroms (and more preferably between 4 and 8 angstroms), and the Pt layers preferably have a thickness between 2 and 20 angstroms (and more preferably between 5 and 15 angstroms).

BRIEF DESCRIPTION OF THE DRAWINGS

FIG. 2 is directed to an experimental method and corresponding results for domain wall velocity measurements, in which:

FIG. 3 is directed to current-driven DW motion in Pt/Co/Ni/Co/TaN wires, in which:

FIG. 4 is directed to DW motion as a function of the number of periods of [Co/Ni] and the thickness of a Pt layer on the top of the stack, with DW velocities being measured for 20 TaN/15 Pt/3 Co/[7 Ni/1.5 Co]$_N$/z Pt/50 TaN, where N is the number of Co/Ni periods and z the thickness of the top Pt layer.

FIG. 5 is directed to DW motion for different underlayers, in which:

FIG. 6 is directed to the influence of the induced moment in Pt at the Pt/Co interface, in which:

DETAILED DESCRIPTION

Figure 1:
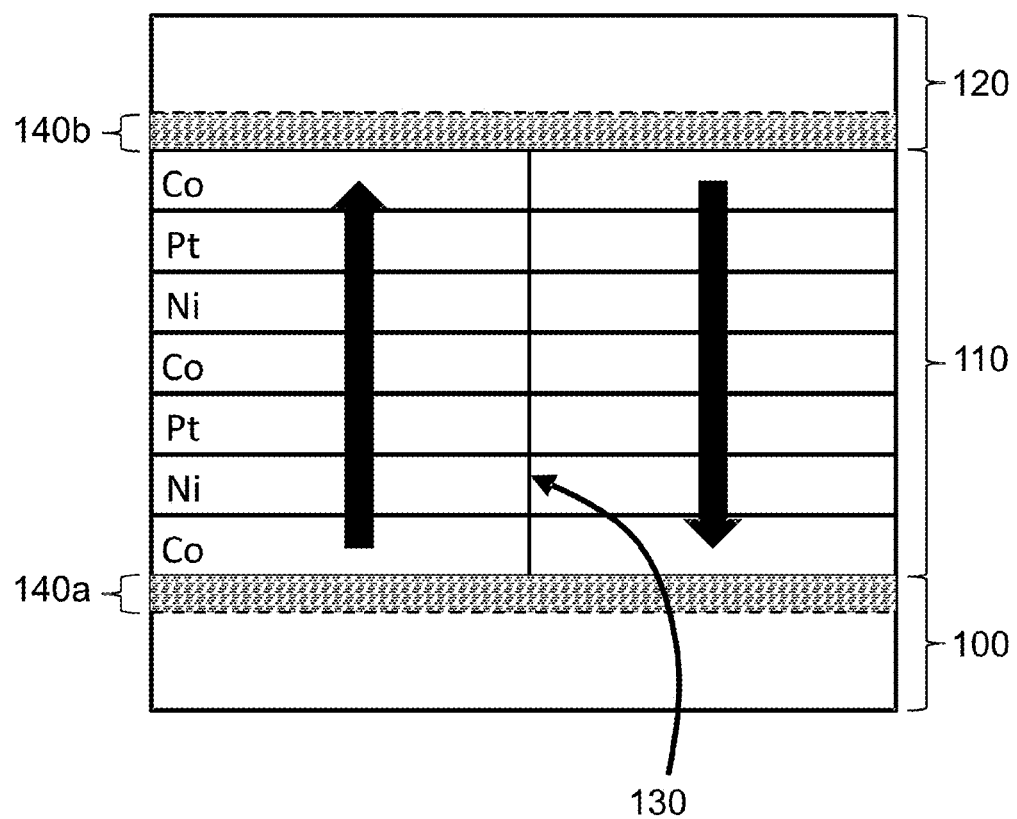
FIG. 1 is a schematic diagram of a preferred embodiment of the invention.

The preferred embodiment of this invention is shown in FIG. 1. An underlayer 100 is first deposited on a substrate. Then intermediate layers 110 are deposited on the underlayer. An overlayer 120 is deposited on top of the intermediate layers. The underlayer, intermediate layers and the overlayer form the magnetic wire within which magnetic domains are introduced. The intermediate layers are formed from a series of layers that include ferromagnetic and/or ferrimagnetic layers. In the preferred embodiment the intermediate layers include a sequence of ferromagnetic layers of Co and ferromagnetic layers of Ni and non-ferromagnetic layers of Pt. The Pt layers are preferably in contact with a Co layer and a Ni layer. As illustrated in FIG. 1, the intermediate layers in the preferred embodiment are formed from layers of Co, Ni, Pt, Co, Ni, Pt and Co deposited successively one after the other. Two magnetic domains are illustrated in FIG. 1 whose magnetization is oriented perpendicular to the interfaces between the Co and Ni layers. In one of the domains the magnetization is oriented with a direction from the underlayer to the overlayer, and in the other domain the magnetization is oriented antiparallel to that of the first domain with a magnetization pointing in a direction from the overlayer to the underlayer. The direction of the magnetization of these domains is illustrated in FIG. 1 by the black arrows. Also shown in FIG. 1 is a region 140a in the underlayer 140 which exhibits a magnetic moment induced by proximity to the adjacent Co layer. Similarly 140b is a region in the overlayer that becomes magnetic due to its proximity to the adjacent Co layer. The domain walls and/or their corresponding domains represent data (information) that may be written into, and/or read out of, the wires using one or more devices integrated into the wire.

Films exhibiting perpendicular magnetic anisotropy (PMA) are deposited by magnetron sputtering on Si wafers coated by a 25 nm thick $SiO_2$ layer. SQUID magnetometry and magneto-optical Kerr microscopy are used to measure the magnetic properties of the films. Three main figures of merit can be used to assess the samples: the squareness of the hysteresis loop, the value of the coercive field, and the domain structure during magnetization reversal in an external magnetic field. Square hysteresis loops guarantee that the magnetization is fully saturated in the perpendicular direction at remanence. Small values of the coercive field are indicative of low pinning leading to small DW propagation fields. Finally, by monitoring the domain structure during magnetization reversal, we can determine whether the reversal process is dominated by nucleation of many reversed domains or by propagation of a few DWs. We find that samples in which domain nucleation dominates are not suitable for current driven DW motion either because the domain structure is unstable under applied current or because DWs are strongly distorted during motion. In the preferred films herein, the Co and Ni layers have an fcc structure and are oriented in the (111) direction.

Current-driven DW motion is studied using devices patterned by lithography and Ar ion milling. UV photolithography is used to fabricate devices having widths down to while electron beam lithography is used for widths between 100 and 500 nm. In most cases the device width has little influence on the DW dynamics. However, in a few cases for which the combined thicknesses of the various metallic layers is greater than ~5-6 nm, domain nucleation dominates over DW motion for micron-sized devices. Experimental results correspond to 2 μm wide devices unless otherwise specified.

Figure 2A:
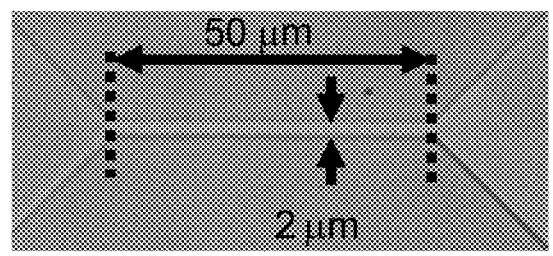
FIG. 2A shows an optical microscopy image of a typical device including a 50 micrometer long, 2 micrometer wide wire connected on each end to wider regions which are used as bond pads for electrical connections.

The optical microscopy image of a typical device is shown in FIG. 2A. The wire in the central portion of FIG. 2A, where DW motion was imaged, is 20 to 50 μm long. This wire is connected at both ends to wider regions that are used as bond pads for electrical connections. In most cases, we find that the PMA is significantly reduced at the wire bonds, such that DWs are nucleated near the bonds and can propagate in the wire under an external field. Once a single DW is injected in the wire, the field is reduced to zero and DW motion is studied by applying a series of current pulses of length $t_P$ to the device.

Figure 2B:
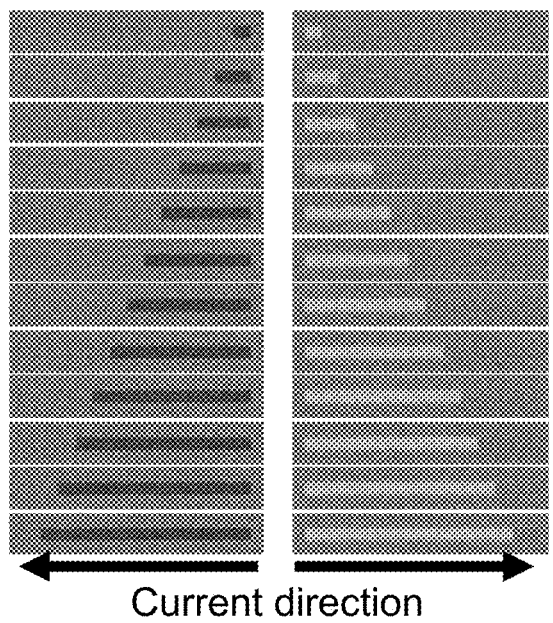
FIG. 2B presents Kerr microscopy images showing the position of a domain wall (DW) in response to series of current pulses. Images are saved at regular intervals chosen such that the DW moves by a measurable amount. The two sequences of images shown in this figure are obtained for two opposite current polarities in a 2 micrometer wide wire made out of 20 TaN/15 Pt/3 Co/7 Ni/1.5 Co/50 TaN (all thicknesses herein are in Å unless otherwise specified). Note that the contrast (white or black) is determined by the magnetization direction of the domain which expands as a result of the motion of the DW.
Figure 2C:
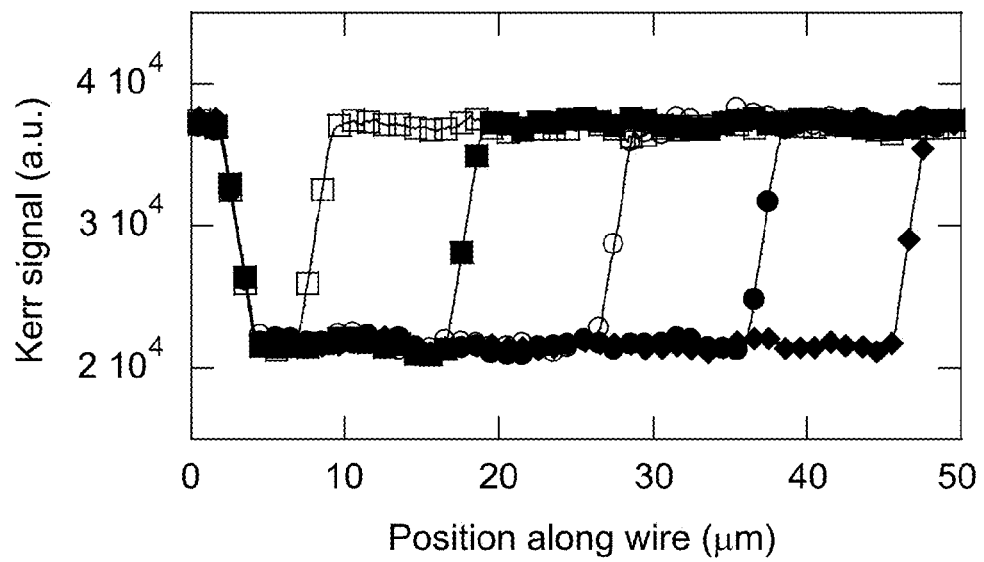
FIG. 2C presents line scans along the wire showing the variation of the Kerr contrast for different positions of the DW. The DW position is measured from these line scans.
Figure 2D:
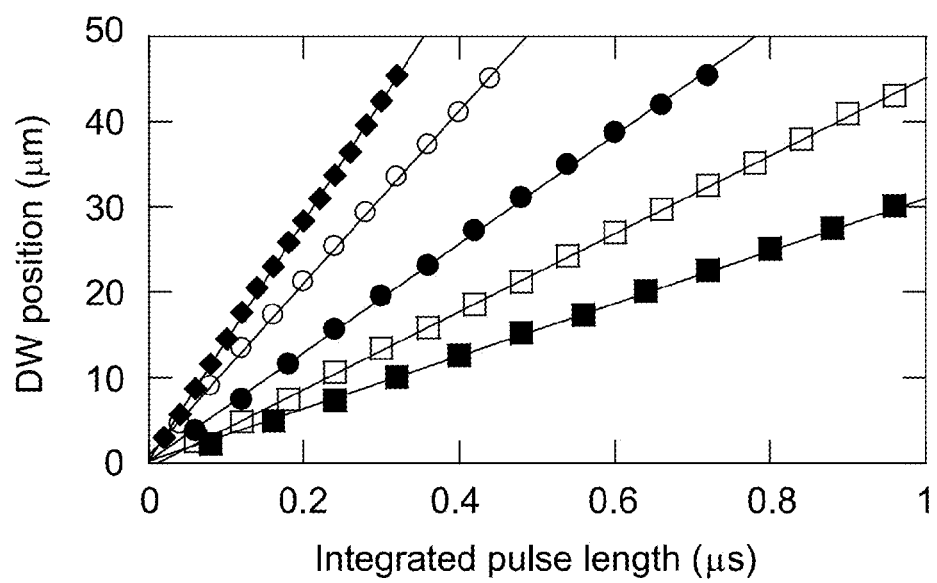
FIG. 2D shows DW position versus integrated current pulse length $t_{CP}$ for current pulses of various amplitudes. Solid lines show linear fits whose slopes are used to determine the velocity of the DW.

Kerr microscopy in differential mode is used to monitor the position of the DW in response to series of current pulses. Images are saved at regular intervals chosen such that the DW moves by a measurable amount between these stored images. Examples of two sequences of images for two different current polarities are shown in FIG. 2B for a 2 µm wide wire made out of 20 TaN/15 Pt/3 Co/7 Ni/1.5 Co/50 TaN (once again, all thicknesses are in Å). The current pulses used here were 25 ns long, and the associated currents had a density of ±1.8 $10^8$ A/cm$^2$. Note that the contrast (white or black) is determined by the magnetization direction of the domain that expands as a result of the motion of the DW. The DW position is determined from the images by automated analysis of the Kerr contrast along the wire (FIG. 2C); the profiles shown in this figure are exemplary and are taken for a current density of +1.6 $10^8$ A/cm$^2$ and various values of $t_{CP}$, which is the product of $t_p$ and the number of pulses applied to the device. The DW velocity is then determined by assuming that the DW moves only during the current pulses. We use a linear fit of the DW position versus the integrated current pulse length $t_{CP}$ (FIG. 2D). FIG. 2D show results for 5 ns long current pulses with current densities of 0.9, 1.01, 1.14, 1.43, and 1.80 $10^8$ A/cm$^2$ (in which increasing current density corresponds to an increased slope in the figure). In some cases, the DW may get pinned by a local defect for some amount of time before it moves again. In these cases, we only fit the portions of the curve in which the position depends linearly on $t_{CP}$. The standard deviation of the differential velocity values calculated for all the points of the DW position vs. $t_{CP}$ curves is used to determine the error bars for the velocity measurement.

Figure 3A:
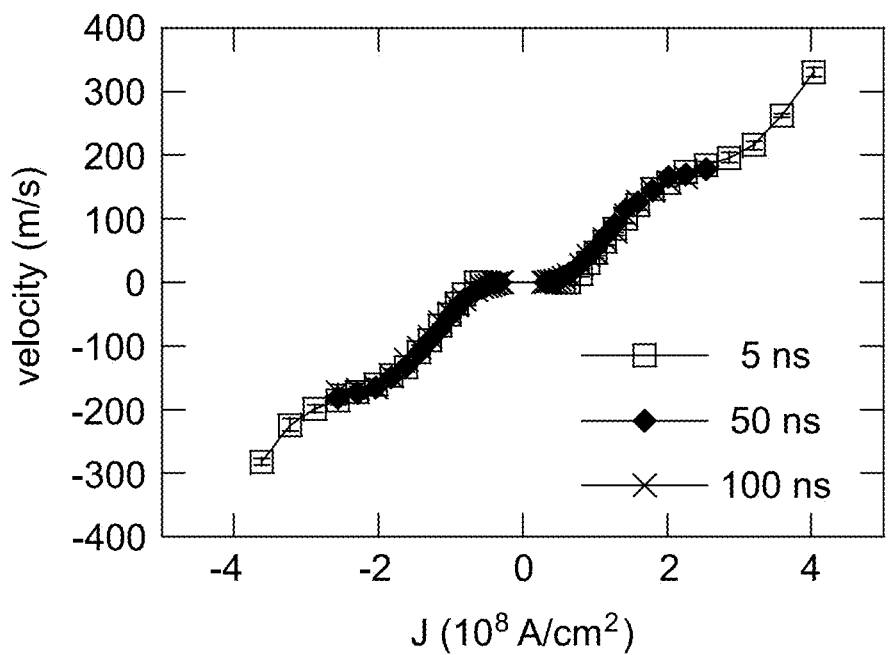
FIG. 3A shows the DW velocity of a device made out of 20 TaN/15 Pt/3 Co/7 Ni/1.5 Co/50 TaN as a function of the current density in response to 5, 50, and 100 ns long current pulses.
Figure 3B:
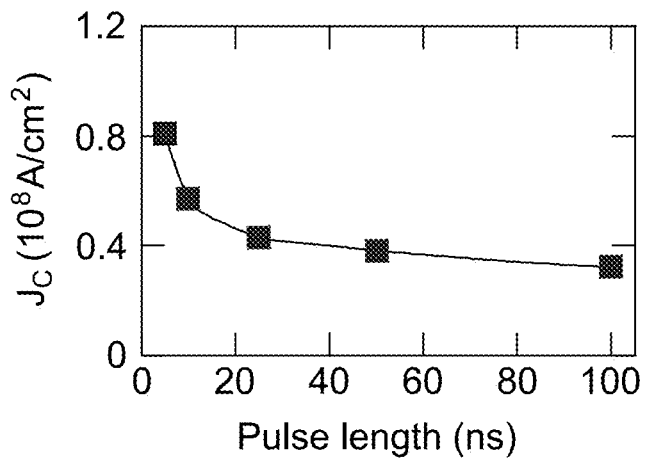
FIG. 3B shows critical current density $J_C$ (the current density above which current driven DW motion is observed) versus current pulse length, for the same device used in FIG. 3A.
Figure 3C:
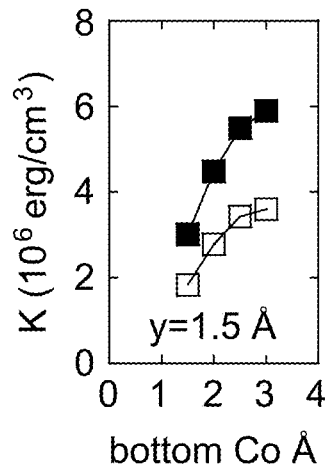
FIG. 3C shows perpendicular magnetic anisotropy (PMA) constants derived from SQUID magnetometry for films made out of 20 TaN/15 Pt/x Co/7 Ni/1.5 Co/50 TaN. The data are presented as a function of the thickness x of the bottom Co layer. Solid symbols show the PMA constant K, and open symbols show the effective anisotropy constant reduced by the demagnetizing energy $K_{eff}=K-2\pi M_S^2$, where $M_S$ is the saturation magnetization.
Figure 3D:
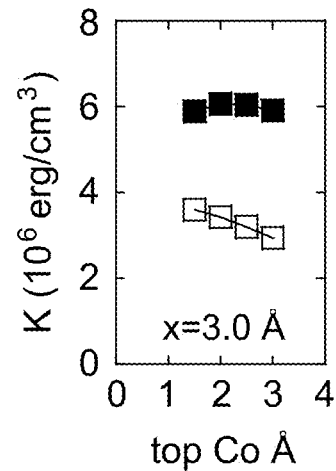
FIG. 3D shows PMA constants derived from SQUID magnetometry for films made out of 20 TaN/15 Pt/1.5 Co/7 Ni/y Co/50 TaN. The data are presented as a function of the thickness y of the top Co layer.
Figure 3E:
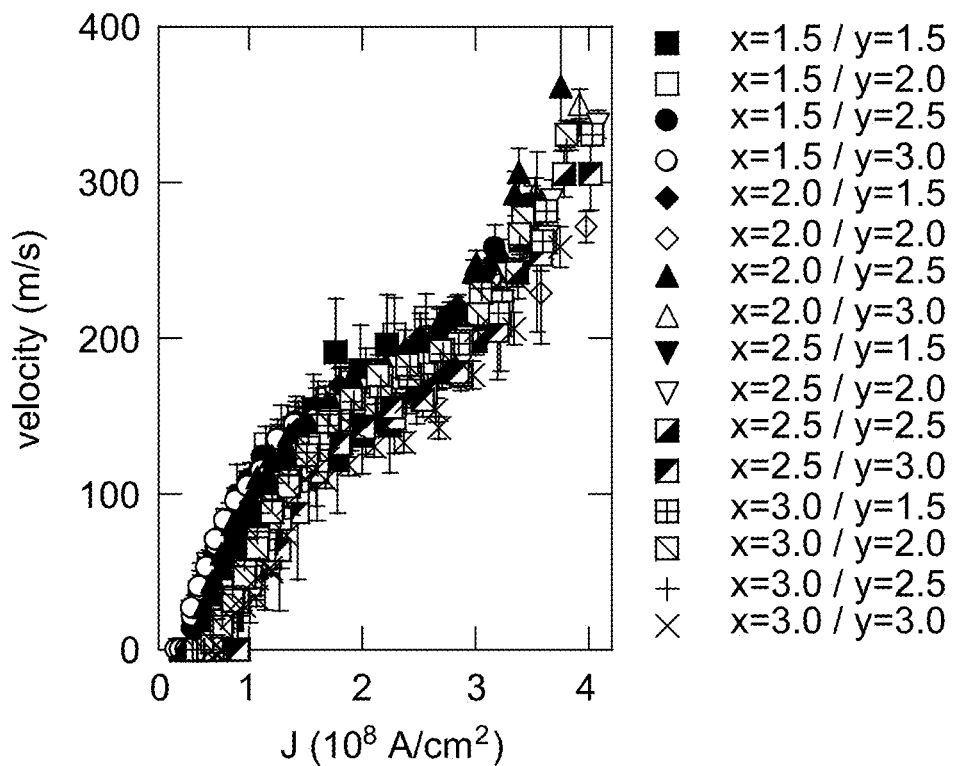
FIG. 3E shows DW velocity as a function of the current density for 16 different devices made out of 20 TaN/15 Pt/x Co/7 Ni/y Co/50 TaN. Data are only shown for positive current and 5 ns long pulses for clarity.
Figure 3F:
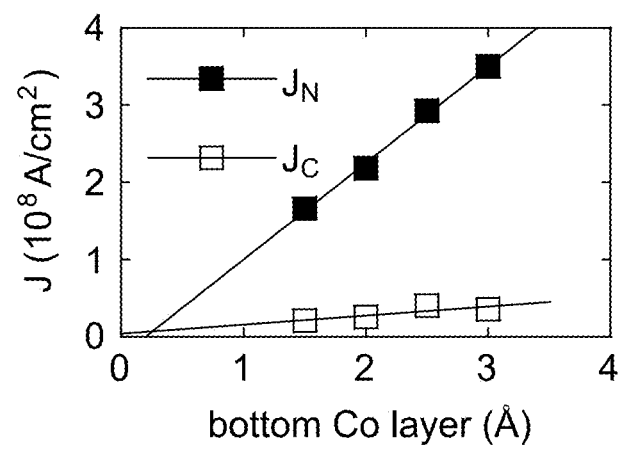
FIG. 3F presents critical and nucleation current densities $J_C$ and $J_N$ for devices made out of 20 TaN/15 Pt/x Co/7 Ni/1.5 Co/50 TaN, as a function of the bottom Co layer thickness x for a 50 ns long pulse.

We first show that the anomalous DW motion at high velocity in the direction opposite to the electron flow is observed for a range of material parameters. FIG. 3 shows results measured on devices made out of a single Co/Ni/Co stack deposited on Pt. The composition of the stack is 20 TaN/15 Pt/x Co/7 Ni/y Co/50 TaN, where the thickness of the two Co layers x and y is varied between 1.5 and 3 Å by 0.5 Å steps. An example of DW velocity measured as a function of current density in response to 5, 50 and 100 ns long current pulses is shown in FIG. 3A for x=3 and y=1.5. The current density J is calculated from the device resistance by assuming uniform conduction in the metallic layers, which in this case have a total thickness of 26.5 Å. DWs move along the current flow when the current density exceeds a threshold value $J_C$ which decreases with $t_P$ (FIG. 3B). Most importantly, the DW dynamics does not depend on the orientation of the magnetic domains: both up/down and down/up DWs move in the same direction, at the same velocity. The maximum current density that can be achieved for reliable DW motion also depends on $t_P$. When the current exceeds a nucleation threshold $J_N$, DW motion is replaced by random nucleation of DWs presumably due to Joule heating and magnetization reversal induced by the Oersted field from the current. Between $J_C$ and $J_N$, the DW wall velocity is almost independent of $t_P$. Indeed, data for all three values of $t_P$ shown in FIG. 3A fall on the same master curve. Similar behavior is also observed for devices having markedly different magnetic properties. As shown in FIG. 3C, the PMA constant K of the samples can be changed systematically by varying the thickness x of the bottom Co layer adjacent to Pt. Also shown in FIG. 3C is the effective anisotropy constant reduced by the demagnetizing energy $K_{eff}=K-2\pi M_S^2$, where $M_S$ is the saturation magnetization. Note that K is much less sensitive to the thickness of the top Co layer (FIG. 3D), as expected since the origin of the PMA is mostly due to the Pt/Co interface. Despite the fact that K varies by more than a factor of 2 among the 16 devices with different Co thicknesses shown in FIG. 3E, DWs move along the current flow, and the velocity vs. J curve follows the same functional form. Note that data are only shown for positive current and 5 ns long pulses for clarity. The magnetic properties of the devices play a much important role on the threshold current densities for motion and nucleation. As shown in FIG. 3F for a 50 ns long current pulse, both $J_C$ and $J_N$ increase linearly with x, that is, when K increases. While $J_C$ varies only marginally, $J_N$ exhibits a much stronger dependence. This suggests that the current-induced domain nucleation process is essentially a magnetization reversal process related to the coercivity of the devices, which itself depend on the PMA constant.

Figures 3G, 3H:
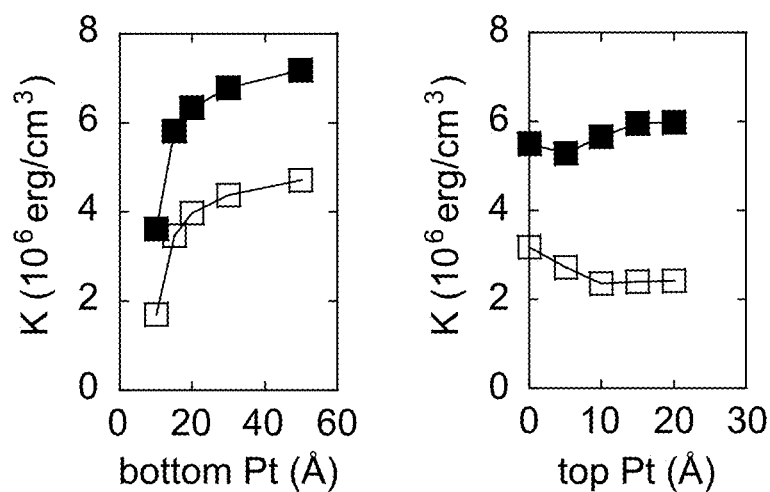
FIG. 3G presents PMA constants for devices made out of 20 TaN/z Pt/3 Co/7 Ni/1.5 Co/50 TaN as a function of the Pt thickness, for devices having no Pt layer on the top.
FIG. 3H presents PMA constants for devices made out of 20 TaN/15 Pt/3 Co/7 Ni/1.5 Co/z Pt/50 TaN as a function of the top Pt thickness z for devices having a 15 Å thick bottom Pt layer.

The PMA constant K is strongly dependent on the thickness of the Pt underlayer deposited below the Co/Ni/Co trilayer. As shown in FIG. 3G, K increases linearly for Pt thicknesses up to ~20 Å, above which it progressively saturates toward a value exceeding 7.2 $10^6$ erg/cm$^3$. On the other hand, the PMA is weakly dependent on the thickness of the Pt overlayer deposited above the Co/Ni/Co trilayer (FIG. 3H). These results clearly show that the Pt/Co and Co/Pt interfaces have significant differences which lead to very different effects on the magnetic properties of the multilayer.

Figure 4A:
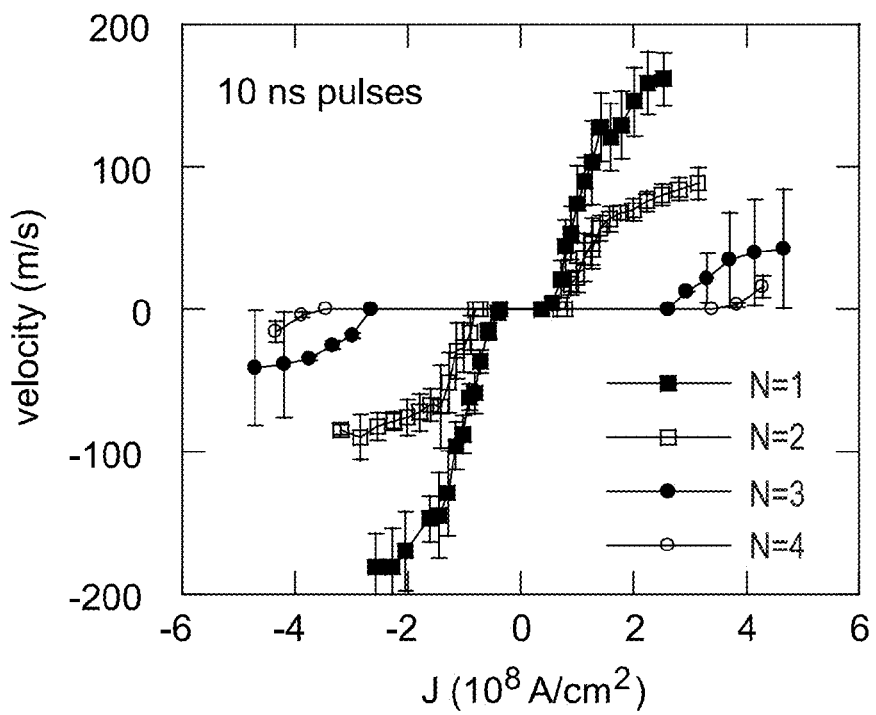
FIG. 4A shows DW velocity versus current density for N=1, 2, 3 and 4 but without any top Pt layer (z=0). Data shown are obtained with 10 ns long pulses.
Figure 4B:
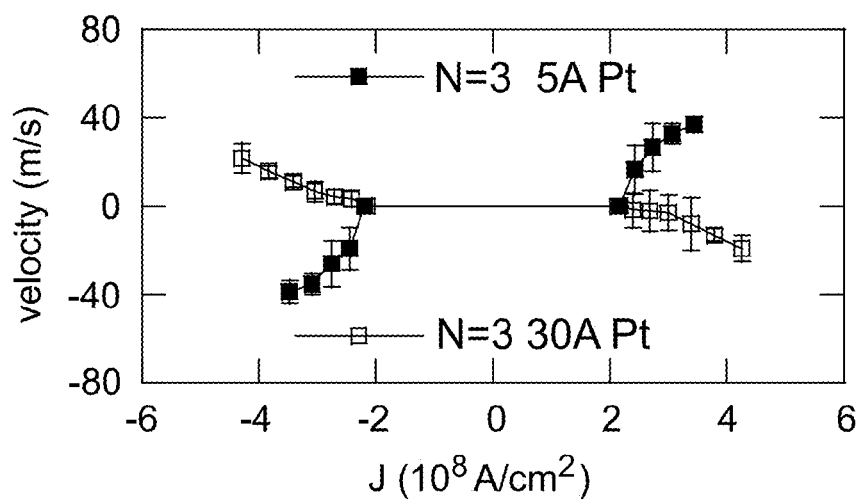
FIG. 4B shows DW velocity versus current density for N=3 and two different top Pt layer thicknesses z=5 and z=30. Note that the sign convention is that DW velocities are positive for positive current when motion is along the electron flow, and negative when motion is along the electron flow.
Figure 4C:
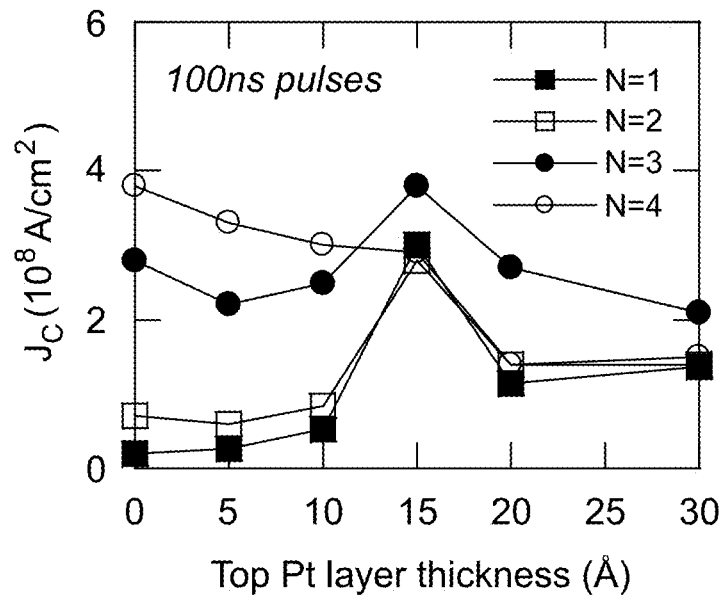
FIG. 4C shows critical current density $J_C$ versus thickness of the top Pt layer z, for N=1, 2, 3 and 4, measured for 100 ns long pulses. $J_C$ goes through a maximum for z=15 Å, which is the value at which the motion direction reverses.
Figure 4D:
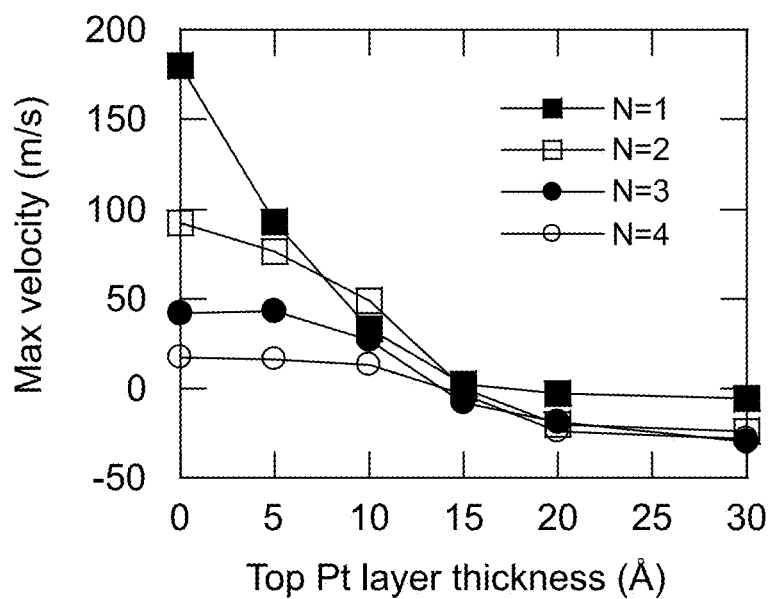
FIG. 4D shows maximum DW velocity versus thickness of the top Pt layer z, for N=1, 2, 3 and 4.

To further investigate the origin of the anomalous DW motion along the current flow, we have varied the number of [Co/Ni] periods N from 1 to 4. For N>4, DW propagation becomes dendritic and no reliable current-driven motion is observed below $J_N$. Interestingly, as shown in FIG. 4A, DW motion remains along the current flow for all the devices with N between 1 and 4, even though the total thickness of the magnetic layers is close to 4 nm in the latter case. However, $J_C$ increases by one order of magnitude while the maximum DW velocity decreases by one order of magnitude (175 to 17 m/s). These results suggest that the torque responsible for the anomalous DW motion has an interfacial origin and is likely due to the Pt/Co interface. Indeed, the key role played by the Pt/Co interface is confirmed by results obtained for symmetric structures capped with a Pt layer. FIG. 4B shows the DW velocity of two devices which both have N=3 but are capped with Pt layers having different thickness z (z=5 and 30 Å for solid and open symbols, respectively). For z=5 Å, results are very similar to those obtained without the Pt cap layer (overlayer). However, results are strikingly different for z=30 Å: the DW motion direction is reversed, such that DWs move in the direction of electron flow. (Note that the sign convention here is such that positive (resp. negative) velocities for positive current density correspond to DW motion along the current (resp. electron) flow direction.) All data obtained for N=1 to 4 and z between 0 and 30 Å are summarized in FIGS. 4C and 4D, which show $J_C$ at $t_P$=100 ns and the maximum measured DW velocity, respectively. $J_C$ goes through a maximum for z=15 Å, at which value the DW velocity changes sign for all values of N. Interestingly, this is the same thickness as that of the bottom Pt layer. The largest velocity in the direction of the electron flow is about −30 m/s and it is observed for N=4 and z=30. These data suggest that the top and bottom Pt layers have opposite effects on DW motion. The resulting DW motion direction is determined by whichever layer is the thickest.

Figure 4G:
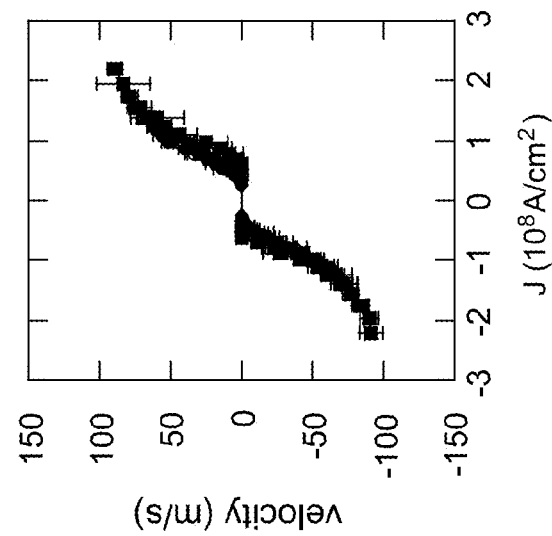
FIGS. 4E-G show DW velocity versus current density for devices made out of 20 TaN/15 Pt/1.5 Co/7 Ni/x Co/10 Pt/y Co/7 Ni/1.5 Co/50 TaN. Current pulse lengths are between 5 and 100 ns. A 10 Å thick Pt layer is inserted in the middle of the magnetic stack. This Pt layer is in contact with one Co layer at its bottom interface (x=0, y=1.5, FIG. 4E), at its top interface (x=1.5, y=0, FIG. 4F) or at both interfaces (x=1.5, y=1.5, FIG. 4G).
Figure 4F:
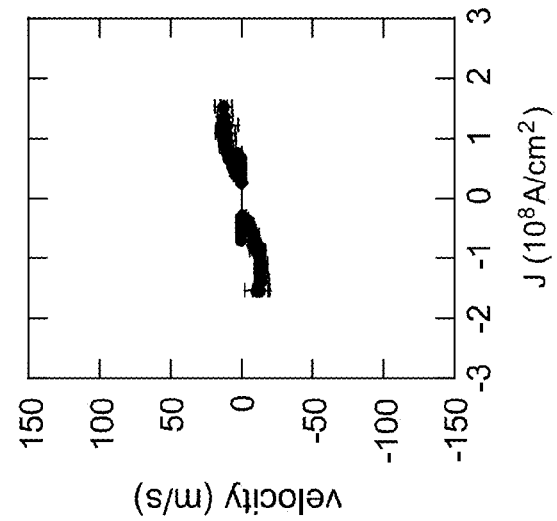
Figure 4E:
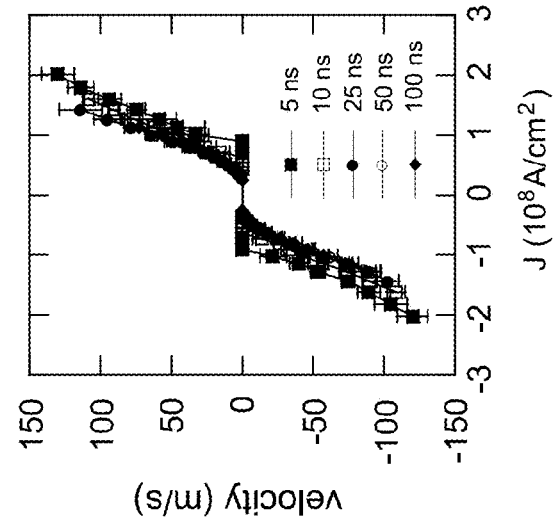

These results suggest that Pt/Co and Co/Pt interfaces lead to DW motion in opposite directions. To confirm this finding, the DW velocity of devices made out of 20 TaN/15 Pt/1.5 Co/7 Ni/x Co/10 Pt/y Co/7 Ni/1.5 Co/50 TaN was measured as a function of the current density for pulse lengths between 5 and 100 ns (FIGS. 4E, 4F, and 4G). A 10 Å thick Pt layer was inserted in the middle of the magnetic stack, with a Co layer inserted below (x=0, y=1.5, FIG. 4E), above (x=1.5, y=0, FIG. 4F) or on either side (x=1.5, y=1.5, FIG. 4G). We find that the DW velocity is determined by the difference between the numbers of Pt/Co and Co/Pt interfaces. In FIG. 4E, where there are only 2 Pt/Co interfaces, the DW velocity is very high (~130 m/s). By contrast, in FIG. 4F, there is one Pt/Co and one Co/Pt interface, and the DW velocity is strongly reduced down to ~30 m/s. Finally in FIG. 4G, in which there are 2 Pt/Co interfaces but also one Co/Pt interface, the DW velocity reaches an intermediate value between the 2 previous examples (~90 m/s). These data confirm that the stack order at the Pt/Co interface plays a key role in the DW motion direction. Pt/Co interfaces lead to motion along the current flow, whereas Co/Pt interfaces favor motion along electron flow. Interestingly, the Pt/Ni interface appears to play a much weaker role.

Figure 5A:
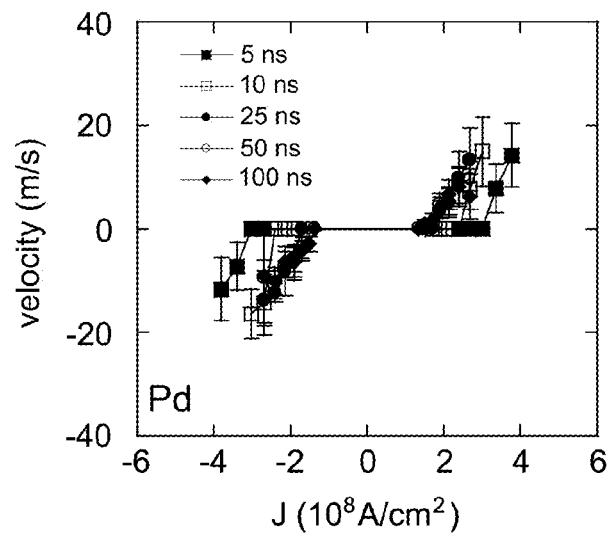
FIGS. 5A-C show DW velocity of devices made out of 50 Ta/50 M/3 Co/7 Ni/1.5 Co/50 TaN as a function of the current density for pulses lengths between 5 and 100 ns and for different metallic underlayers M: Pd (FIG. 5A), Ir (FIG. 5B), and Au (FIG. 5C).
Figure 5B:
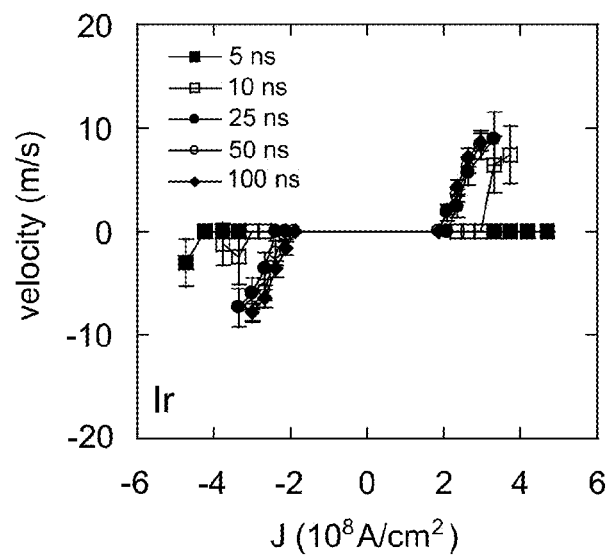
Figure 5C:
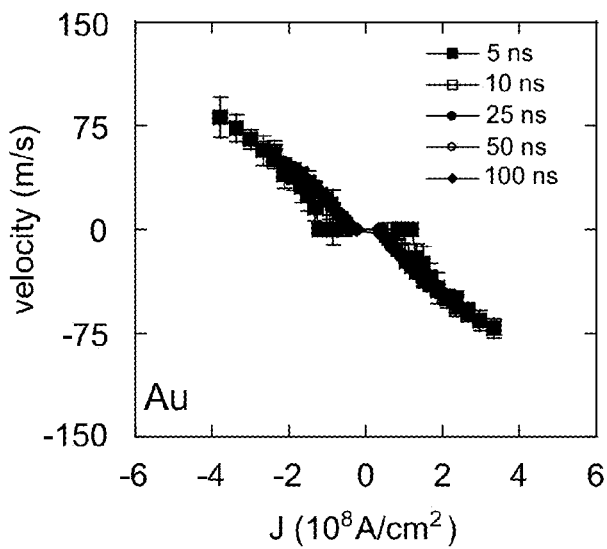
Figure 5D:
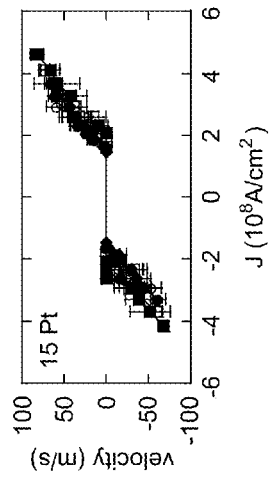
FIGS. 5D-I show DW velocity of devices made out of 50 Ta/(15-z) Au/z Pt/3 Co/7 Ni/1.5 Co/50 TaN as a function of the current density for pulses lengths between 5 and 100 ns.
Figure 5E:
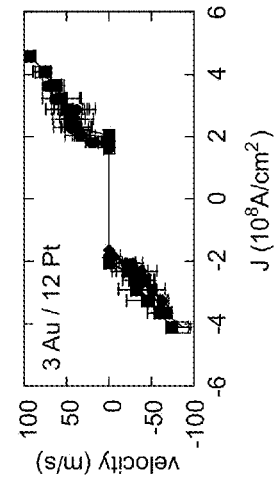
Figure 5F:
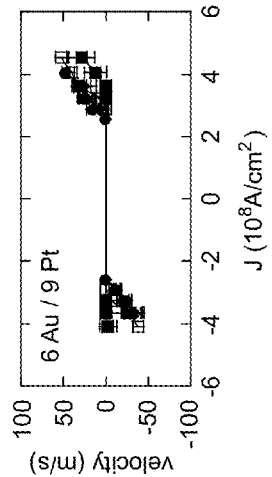
Figure 5G:
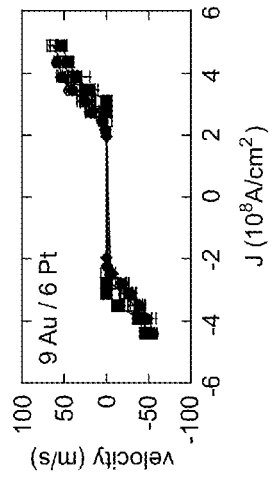
Figure 5H:
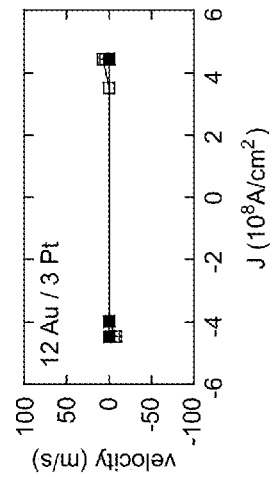
Figure 5I:
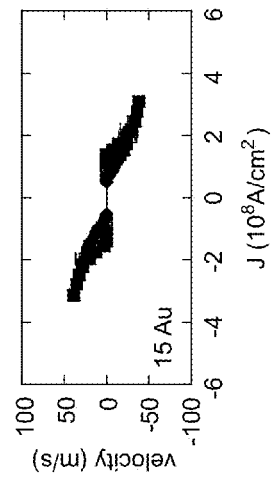

To understand the origin of the anomalous DW motion observed with Pt layers, it is important to explore the effect of other materials. We find that several metallic underlayers lead to good PMA and magnetic properties suitable for studying DW motion. The structure of the stacks is 50 Ta/50 M/3 Co/7 Ni/1.5 Co/50 TaN (all thicknesses in Å), with M=Pd, Ir, and Au. Note that Ta is used as seed layer instead of TaN. Current shunting through this layer accounts for 10 to 20% of the total current density flowing in the devices. As shown in FIGS. 5A, 5B, and 5C, DW motion is along the current flow for Pd and Ir, but is along the electron flow for Au. Even though Pd and Ir underlayers lead to motion in the same direction as in Pt, the maximum DW velocity is more than 10 times smaller (15 and 9 m/s, respectively) and $J_c$ significantly increased. In the case of Au, motion along the electron flow reaches 80 m/s. Interestingly, Pt, Ir and Au all have significant SOI, but they do not have the same effect on DW motion. By contrast, while the SOI in Pd is small, it still leads to anomalous motion in the direction of the current. These results suggest that the SOI is not the sole cause for our observation.

We propose that the induced magnetic moment at the interface between the metallic underlayer and the Co layer plays an important role. This induced moment is significant for Pt, Pd and Ir but it is very small for Au. To test this hypothesis, we have fabricated structures in which Au and Pt are combined in the same underlayer. We first consider the case in which Pt is deposited on top of the Au layer. The structure of the films is 50 Ta/(15-x) Au/x Pt/3 Co/[7 Ni/1.5 Co]$_2$/50 TaN, where the thickness of the Pt layer x is varied from 0 to 15 Å. The DW velocity is shown in FIGS. 5D-I as a function of the current density for pulses lengths between 5 and 100 ns. As discussed above, the DW motion is along the electron flow for x=0. For x=3, the DW velocity drops to almost zero while $J_c$ increases by one order of magnitude, indicating that the influence of the Au and Pt layers almost cancel each other. For x=6, DW motion takes place along the current flow. The velocity increases and $J_c$ decreases for x>6 up to 15 Å, but the dependence is much weaker. These data show that the mechanism responsible for the anomalous DW motion along the current flow only takes place when the thickness of the Pt layer exceeds a critical value between 3 and 6 Å. Thicker layers have little influence on the DW dynamics. Interestingly, this critical thickness is smaller than the spin diffusion length of Pt, but corresponds to the typical length over which significant magnetic moments are induced in Pt (2 to 4 atomic layers). The induced magnetic moment is largely parallel to that of the magnetic layers. However, a significant component may be parallel to the interface because of the Dzyaloshinskii-Moriya interaction at the Pt/Co interface.

Figure 6A:
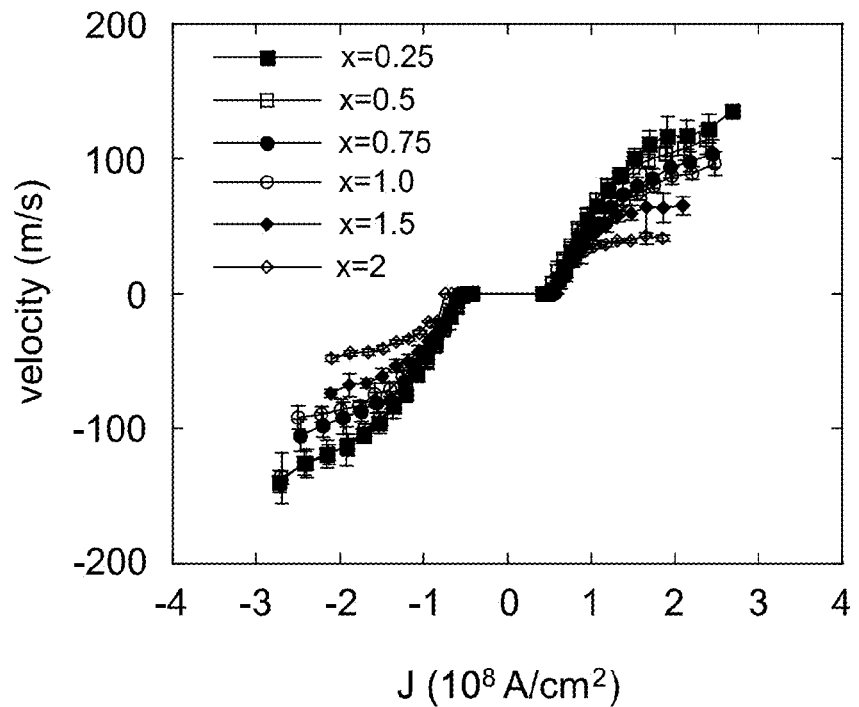
FIG. 6A shows DW velocity versus current density for devices made out of 50 Ta/(15-x) Pt/x Au/3 Co/7 Ni/1.5 Co/50 TaN for 10 ns long current pulses. A thin layer of Au of thickness x between 0.25 and 2 is inserted at the Pt/Co interface.
Figure 6B:
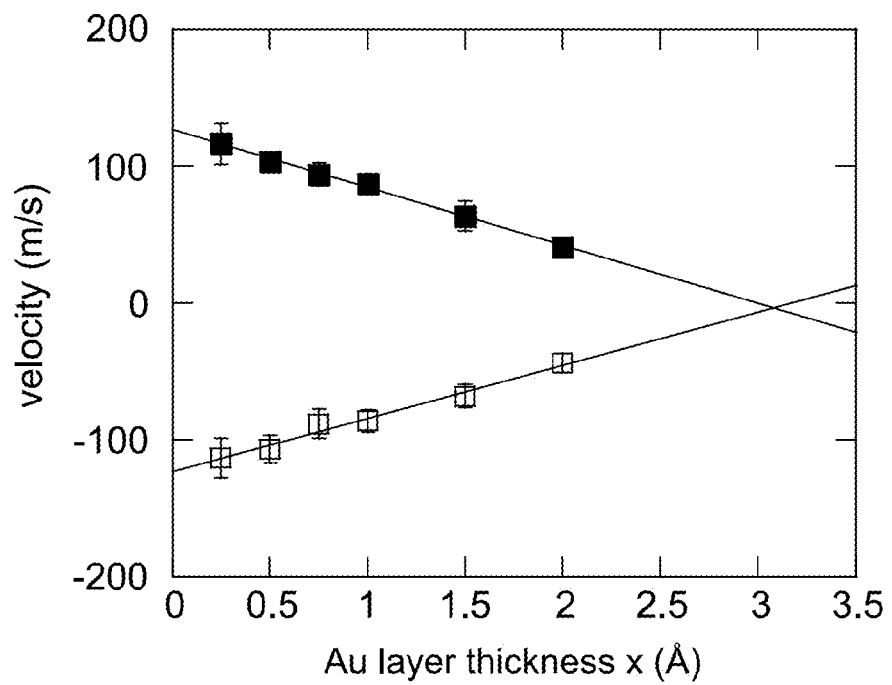
FIG. 6B shows DW velocity as a function of x for a constant current density J=±1.9 10$^8$ A/cm$^2$, which is the maximum value smaller than $J_N$ for all samples. The DW velocity decreases linearly with x and it extrapolates to 0 for x ~3 Å.

We now turn to the case in which a thin layer of Au is inserted between the Pt and Co layers. The structure of the films is 50 Ta/(15-x) Pt/x Au/3 Co/7 Ni/1.5 Co/50 TaN. We find that the PMA decreases rapidly when x increases. Indeed, the films are no longer magnetized perpendicular to the plane for x>2. The DW velocity versus current density is shown in FIG. 6A for x between 0.25 and 2 for 10 ns long current pulses. Motion is along the current flow for all values of x, but the DW velocity is reduced significantly for increasing x. Note that $J_C$ is almost independent of x, whereas $J_N$ decreases with x as a result of the smaller PMA. FIG. 6B shows the velocity as a function of x for a constant current density J=±1.9 $10^8$ A/cm$^2$, which is the maximum value smaller than $J_N$ for all samples. The DW velocity decreases linearly with x and it extrapolates to 0 for x ~3 Å. Once again, the critical thickness is much smaller than the spin diffusion length in Au. Thus, spin accumulated at the surface of the Pt layer could diffuse across the Au layer without being much affected. By contrast, the moment induced in Pt would be strongly reduced by the interstitial Au layer and vanish almost entirely when the Au layer covers the Pt surface.

Figure 7A:
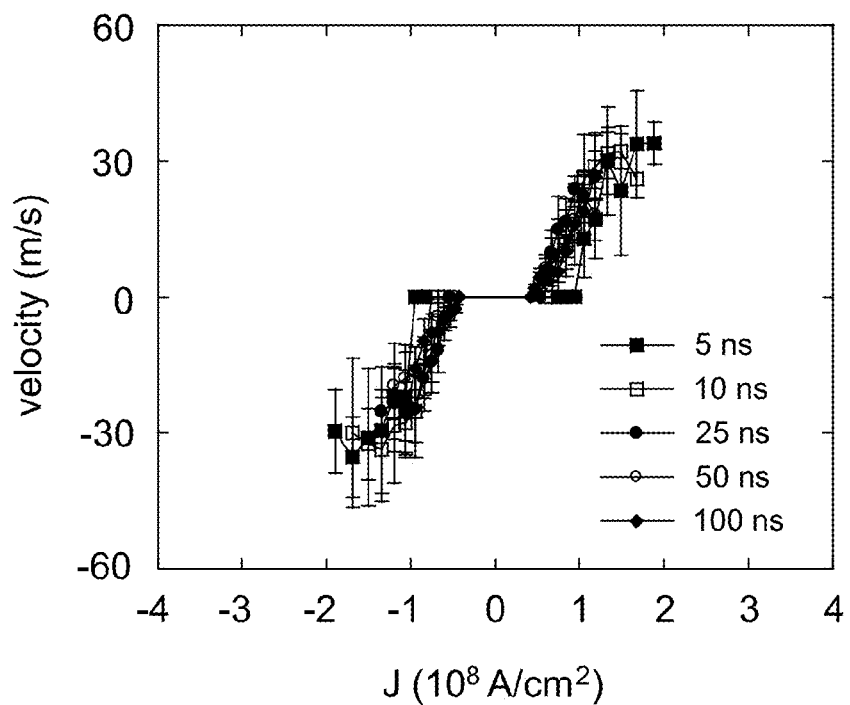
FIG. 7 is directed to fine control of the DW motion direction by stack engineering. The DW velocity was investigated for devices made out of 50 Ta/10 Au/5 Pt/x Co/7 Ni/y Co/20 Pt/50 TaN, as a function of the current density for pulse lengths between 5 and 100 ns. The thicknesses of the top and bottom Pt layers are chosen such that their effects almost compensate each other, leading to a strong sensitivity of the current direction on the thickness of the magnetic layers. As a result, depending on the thickness of the two Co layers, DW motion can be reversed from the current direction (x=1.5, y=3, FIG. 7A) to the electron flow direction (x=3, y=1.5, FIG. 7B).
Figure 7B:
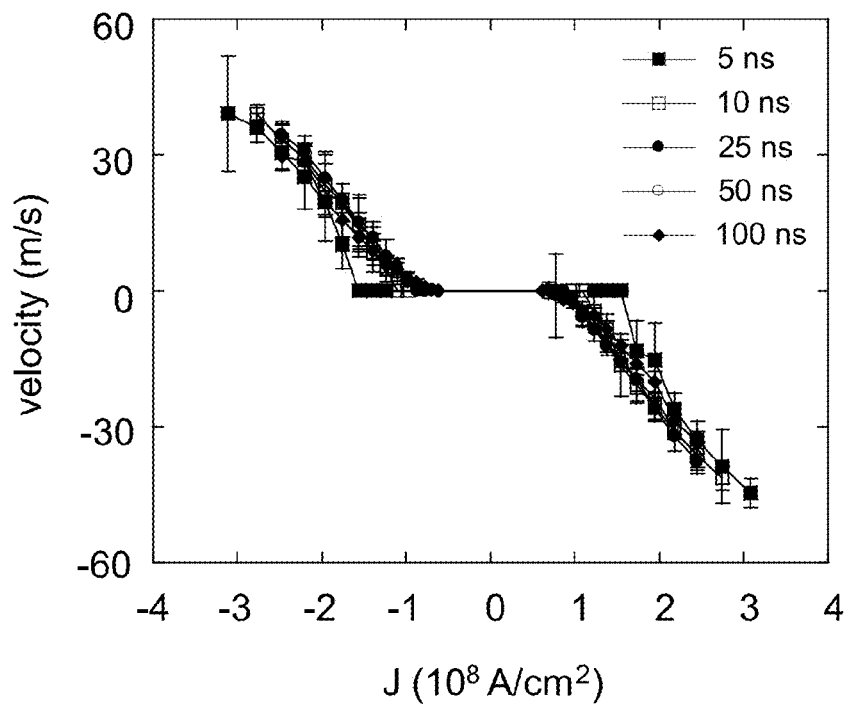

By tuning the thickness and composition of the top and bottom metallic layers, we can engineer the stack such that the effects of the top and bottom interfaces almost cancel each other. In this case, other subtle features of the interface-driven DW motion mechanism are revealed. In the experiments shown in FIGS. 7A and 7B, we vary the thickness of the Co layer at the Pt/Co and Co/Pt interfaces. The film stack is as follows: 50 Ta/10 Au/5 Pt/x Co/7 Ni/y Co/20 Pt/50 TaN. DW motion is reversed from the current direction (x=1.5, y=3, FIG. 7A) to the electron flow direction (x=3, y=1.5, FIG. 7B) by simply changing the thickness of the Co layers. The origin of this behavior might be related to different values on the PMA constant, which is $K_{eff}$~0.6 $10^6$ and 1.6 $10^6$ erg/cm$^3$ for (a) and (b), respectively.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
   providing a magnetic wire that acts as a track for the motion of a domain wall, the wire including:
   an underlayer;
   an overlayer; and
   intermediate layers between the underlayer and the overlayer, the intermediate layers including (i) at least one bilayer selected from the group consisting of Co/Ni and Ni/Co, wherein each Ni layer in said at least one bilayer is ferromagnetic and includes at least 20 atomic percent Ni, and each Co layer in said at least one bilayer is ferromagnetic and includes at least 20 atomic percent Co and (ii) a Pt layer in contact with two of the intermediate layers, one of which is Co and the other of which is Ni, wherein the Pt layer includes at least 70 atomic percent Pt, the wire having an easy magnetization direction perpendicular to an interface separating adjacent Co and Ni layers in the intermediate layers, and
   wherein the underlayer, the overlayer, and the intermediate layers extend along at least a portion of the length of the wire; and applying current to the wire, thereby moving a domain wall along the wire, wherein the domain wall extends (i) across all of the intermediate layers and (ii) into at least a portion of the underlayer and/or into at least a portion of the overlayer.

2. The method of claim 1, comprising applying current to the wire, thereby moving a plurality of domain walls along the wire.

3. The method of claim 1, wherein each Ni layer in said at least one bilayer is fcc and (111) oriented.

4. The method of claim 1, wherein each Co layer in said at least one bilayer is fcc and (111) oriented.

5. The method of claim 1, wherein each Co layer in said at least one bilayer has a thickness between 1 and 10 angstroms.

6. The method of claim 1, wherein each Co layer in said at least one bilayer has a thickness between 1 and 4.5 angstroms.

7. The method of claim 1, wherein each Ni layer in said at least one bilayer has a thickness between 1 and 10 angstroms.

8. The method of claim 1, wherein each Ni layer in said at least one bilayer has a thickness between 4 and 8 angstroms.

9. The method of claim 1, wherein the Pt layer has a thickness between 2 and 20 angstroms.

10. The method of claim 1, wherein the Pt layer has a thickness between 5 and 15 angstroms.

11. The method of claim 1, wherein the overlayer and/or the underlayer has a magnetic moment that is induced by its proximity to a Co layer.

12. The method of claim 11, wherein a portion of the induced moment is parallel to the interface.

13. The method of claim 11, wherein a portion of the induced moment is perpendicular to the interface.

14. The method of claim 1, wherein at least one of the overlayer and underlayer includes a material selected from the group consisting of Pt, Pd, and Ir, and wherein the selected material is in contact with a layer of Co.

15. The method of claim 14, wherein the domain wall moves in the direction of the applied current, the underlayer including Pt.

16. The method of claim 14, wherein the domain wall moves in the direction opposite to that of the applied current, the overlayer including a material selected from the group consisting of Pt, Pd, and Ir.

17. The method of claim 14, wherein the domain wall moves in the direction of the applied current, the number of Pt/Co interfaces in the wire being greater than the number of Co/Pt interfaces in the wire.

18. The method of claim 14, wherein the domain wall moves in the direction opposite to that of the applied current, the number of Co/Pt interfaces in the wire being greater than the number of Pt/Co interfaces in the wire.

19. A method, comprising:
providing a magnetic wire that acts as a track for the motion of a domain wall, the wire including at least one trilayer selected from the group consisting of Co/Pt/Ni and Ni/Pt/Co, the trilayer extending along at least a portion of the length of the wire, wherein:
  each Ni layer in said at least one trilayer is ferromagnetic and includes at least 20 atomic percent Ni,
  each Co layer in said at least one trilayer is ferromagnetic and includes at least 20 atomic percent Co,
  the Pt layer includes at least 70 atomic percent Pt, and
  the wire has an easy magnetization direction perpendicular to an interface separating adjacent Co and Ni layers in the trilayer; and
applying current to the wire, thereby moving a domain wall along the wire, wherein the domain wall extends throughout the trilayer.

20. The method of claim 19, wherein each Ni layer and each Co layer in said at least one trilayer is fcc and (111) oriented.

21. The method of claim 19, wherein each Co layer in said at least one trilayer has a thickness between 1 and 10 angstroms, each Ni layer in said at least one trilayer has a thickness between 1 and 10 angstroms, and each Pt layer in said at least one trilayer has a thickness between 2 and 20 angstroms.

22. The method of claim 19, wherein the trilayer is contacted on opposite sides by an underlayer and an overlayer.

23. The method of claim 22, wherein the overlayer and/or the underlayer has a magnetic moment that is induced by its proximity to a Co layer in the trilayer.

24. The method of claim 22, wherein at least one of the overlayer and underlayer includes a material selected from the group consisting of Pt, Pd, and Ir, and wherein the selected material is in contact with a layer of Co.

25. The method of claim 24, wherein the domain wall moves in the direction of the applied current, the underlayer including a material selected from the group consisting of Pt, Pd, and Ir.

26. The method of claim 24, wherein the domain wall moves in the direction opposite to that of the applied current, the overlayer including Pt.

27. The method of claim 24, wherein the domain wall moves in the direction of the applied current, the number of Pt/Co interfaces in the wire being greater than the number of Co/Pt interfaces in the wire.

28. The method of claim 24, wherein the domain wall moves in the direction opposite to that of the applied current, the number of Co/Pt interfaces in the wire being greater than the number of Pt/Co interfaces in the wire.

* * * * *